United States Patent
Ueno

(10) Patent No.: US 11,316,013 B2
(45) Date of Patent: Apr. 26, 2022

(54) NITRIDE SEMICONDUCTOR DEVICE

(71) Applicant: FUJI ELECTRIC CO., LTD., Kawasaki (JP)

(72) Inventor: Katsunori Ueno, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 191 days.

(21) Appl. No.: 16/776,010

(22) Filed: Jan. 29, 2020

(65) Prior Publication Data

US 2020/0411642 A1  Dec. 31, 2020

(30) Foreign Application Priority Data

Jun. 26, 2019  (JP) .............................. JP2019-118277

(51) Int. Cl.
| | |
|---|---|
| H01L 29/06 | (2006.01) |
| H01L 29/08 | (2006.01) |
| H01L 29/78 | (2006.01) |
| H01L 29/417 | (2006.01) |

(52) U.S. Cl.
CPC ........ *H01L 29/0696* (2013.01); *H01L 29/086* (2013.01); *H01L 29/41741* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 5,864,159 A | 1/1999 | Takahashi | |
| 6,238,980 B1 * | 5/2001 | Ueno | .................. H01L 29/7802 |
| | | | 438/268 |
| 2018/0374948 A1 * | 12/2018 | Naito | .................... H01L 29/739 |

FOREIGN PATENT DOCUMENTS

| | | |
|---|---|---|
| JP | 2002-543587 A | 12/2002 |
| JP | 2011-199061 A | 10/2011 |
| JP | 8-167711 A | 5/2018 |
| WO | WO 00/65646 A1 | 11/2000 |
| WO | WO-2018052098 A1 * | 3/2018 ......... H01L 29/0696 |

OTHER PUBLICATIONS

"Research of GaN vertical device using ion implantation" in the poster for the open seminar of SIP, Next generation power electronics Mar. 28, 2019 (please see attached statement of relevance).

* cited by examiner

*Primary Examiner* — Robert K Carpenter

(57) ABSTRACT

A nitride semiconductor device includes a nitride semiconductor layer, channel cells in the nitride semiconductor layer, a source lead region of a second conductivity type in the nitride semiconductor layer, and a source electrode on a side where a first main surface of the nitride semiconductor layer is located. The channel cells each include a well region of a first conductivity type and a source region of the second conductivity type in contact with the well region. The source lead region is connected to the source region. The channel cells extend in a first direction in a planar view from a normal direction of the first main surface, and arranged in a second direction intersecting with the first direction in the planar view. The source electrode is in contact with the source lead region away from a line of the channel cells arranged in the second direction.

14 Claims, 11 Drawing Sheets

NITRIDE SEMICONDUCTOR DEVICE

CROSS-REFERENCE TO RELATED APPLICATIONS

This application claims benefit of priority under 35 USC 119 based on Japanese Patent Application No. 2019-118277 filed on Jun. 26, 2019, the entire contents of which is incorporated by reference herein.

TECHNICAL FIELD

The present invention relates to a nitride semiconductor device.

BACKGROUND ART

Insulated gate semiconductor devices having a trench structure are conventionally known in which trenches are formed in a drift region of a semiconductor substrate, and include a gate insulating film and a gate electrode thereinside (e.g. see PTL 1).

CITATION LIST

Patent Literature

PTL 1: JP H08-167711 A

SUMMARY OF INVENTION

Technical Problem

There has been a desire for a nitride semiconductor device capable of reducing on-resistance.

The present invention has been made in view of the above problem, and it is an object of the invention to provide a nitride semiconductor device capable of reducing on-resistance.

Solution to Problem

To solve the problem, a nitride semiconductor device according to one aspect of the present invention includes a nitride semiconductor layer, a plurality of channel cells provided in the nitride semiconductor layer, a source lead region of a second conductivity type provided in the nitride semiconductor layer, and a source electrode provided on a side where a first main surface of the nitride semiconductor layer is located. The channel cells each include a well region of a first conductivity type and a source region of the second conductivity type in contact with the well region. The source lead region is connected to the source region. The plurality of channel cells extend in a first direction in a planar view from a normal direction of the first main surface, and are arranged in a second direction intersecting with the first direction in the planar view. The source electrode is in contact with the source lead region in a position away from a line of the plurality of channel cells arranged in the second direction.

Advantageous Effects of Invention

According to the present invention, there can be provided a nitride semiconductor device capable of reducing on-resistance.

DESCRIPTION OF EMBODIMENTS

Hereinafter, embodiments of the present invention will be described. In the following description of the drawings, the same or similar portions are denoted by the same or similar reference signs. However, it should be noted that the drawings are schematic, and the relationships between thickness and planar dimensions, the thickness ratios between respective devices and those between respective members, and the like are different from actual ones. Thus, specific thicknesses and dimensions should be determined in consideration of the following description. Moreover, it is obvious that there are some differences in mutual dimensional relationships and ratios between the drawings.

In the following description, Z axis positive direction may be referred to as "upper", and Z axis negative direction may be referred to as "lower". The terms "upper" and "lower" do not necessarily mean a vertical direction relative to the ground. In short, "upper" and "lower" directions are not limited to the direction of gravity. The terms "upper" and "lower" are merely expressions used for convenience to specify relative positional relationships between regions, layers, films, substrates, and the like, and do not limit the technological idea of the present invention. For example, it is obvious that when paper is rotated by 180 degrees, the surfaces thereof are turned upside down.

In the description below, the term "planar view" means to view from a normal direction (for example, the Z axis direction) of a front surface 10a of a GaN layer 10

The following description will exemplify a case where first conductivity type is P type, and second conductivity type is N type. However, the conductivity types may be selected in an opposite relationship, in which the first conductivity type may be N type, and the second conductivity type may be P type. Additionally, symbols "+" and "−" added to "P" and "N" indicate that respective semiconductor regions have a relatively high or low impurity concentration as compared with those without "+" and "−". However, it is not meant that respective semiconductor regions added with the same symbol "P" have exactly the same impurity concentration.

Embodiment 1

(Exemplary Structure of GaN Semiconductor Device)

Figure 1:
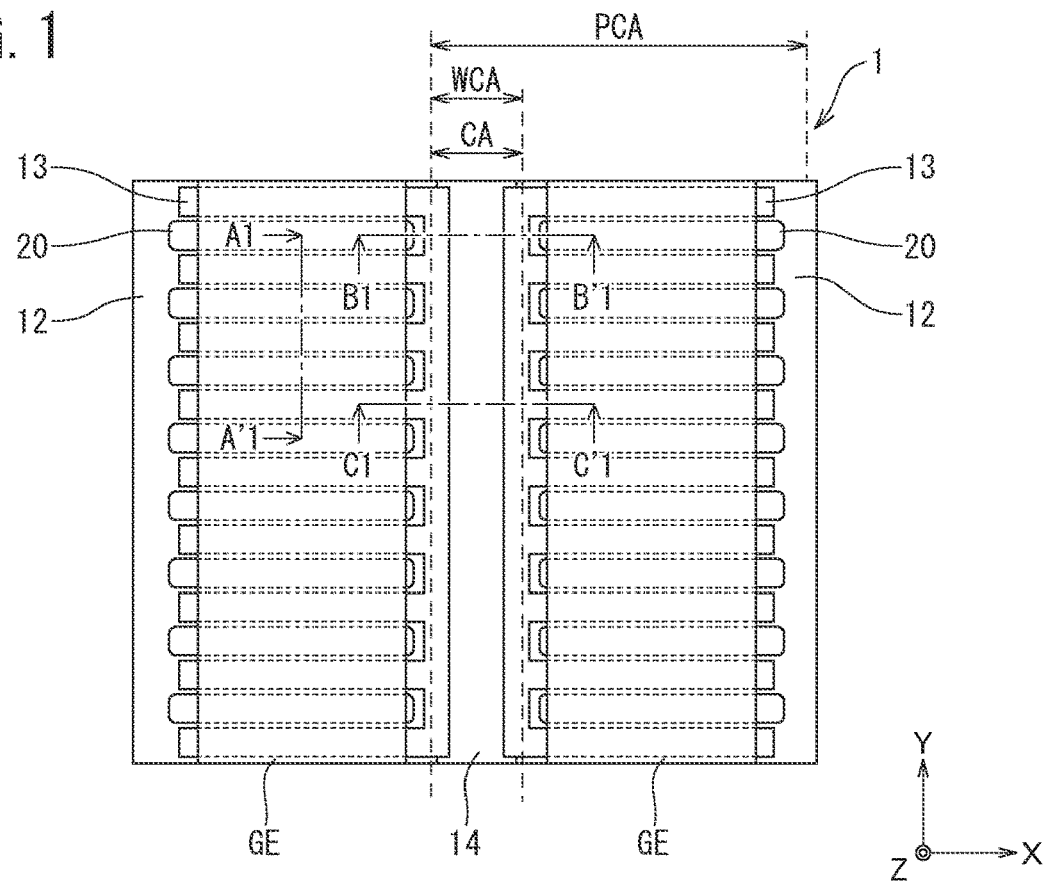
FIG. 1 is a plan view illustrating an exemplary structure of a nitride gallium semiconductor device according to Embodiment 1 of the present invention.
Figure 2:
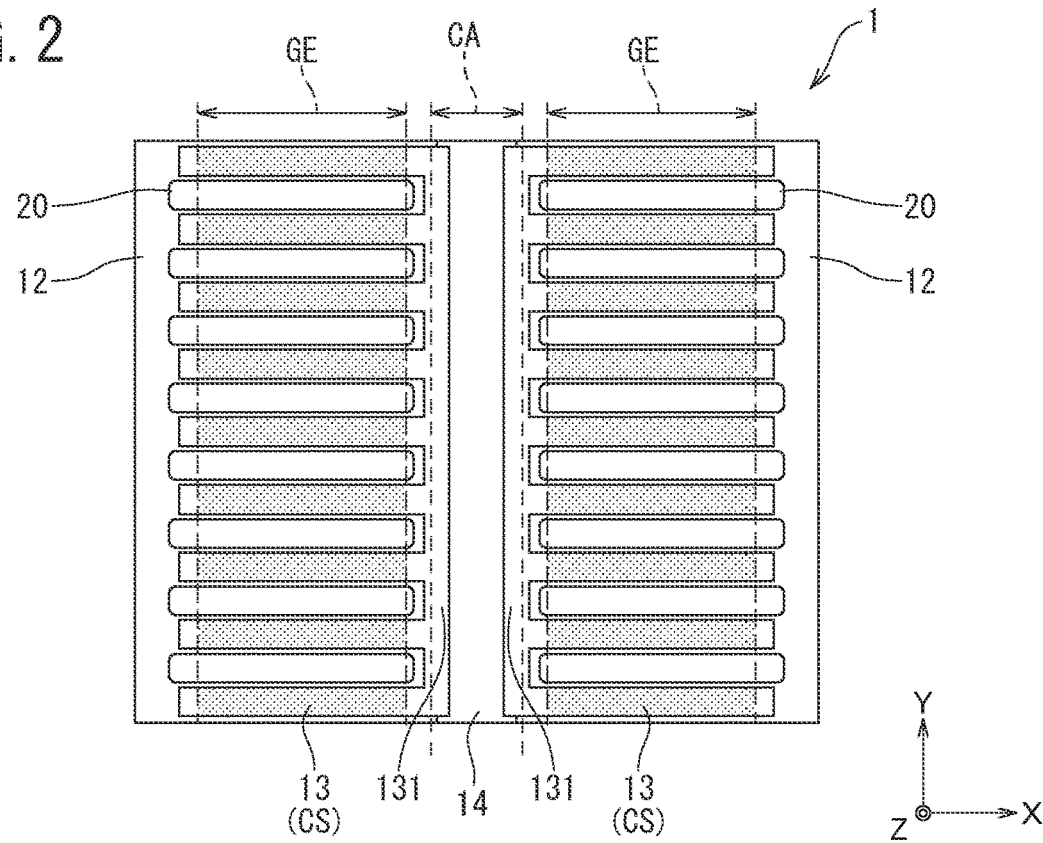
FIG. 2 is a plan view illustrating the exemplary structure of the nitride gallium semiconductor device according to Embodiment 1 of the present invention.
Figure 3:
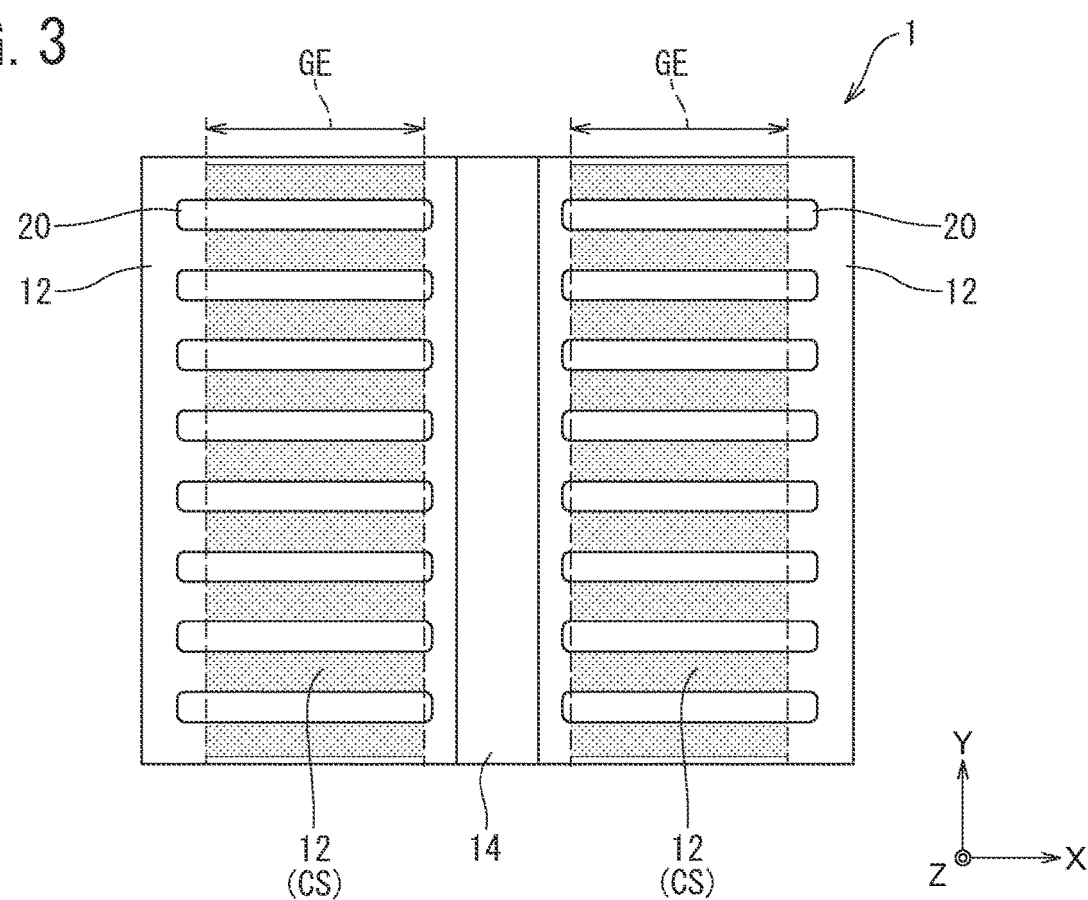
FIG. 3 is a plan view illustrating the exemplary structure of the nitride gallium semiconductor device according to Embodiment 1 of the present invention.
Figure 4A:
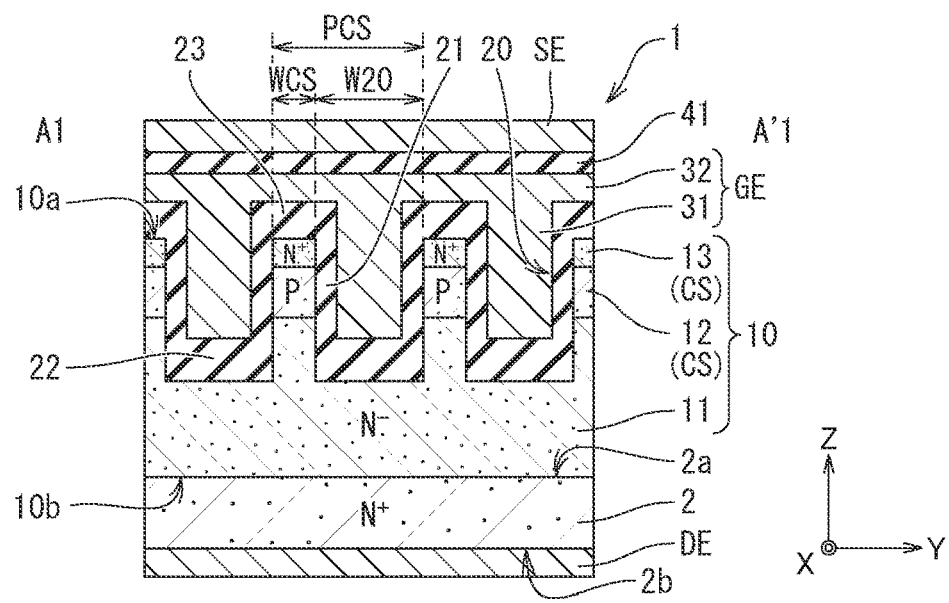
FIG. 4A is a cross-sectional view illustrating the exemplary structure of the nitride gallium semiconductor device according to Embodiment 1 of the present invention.
Figure 4B:
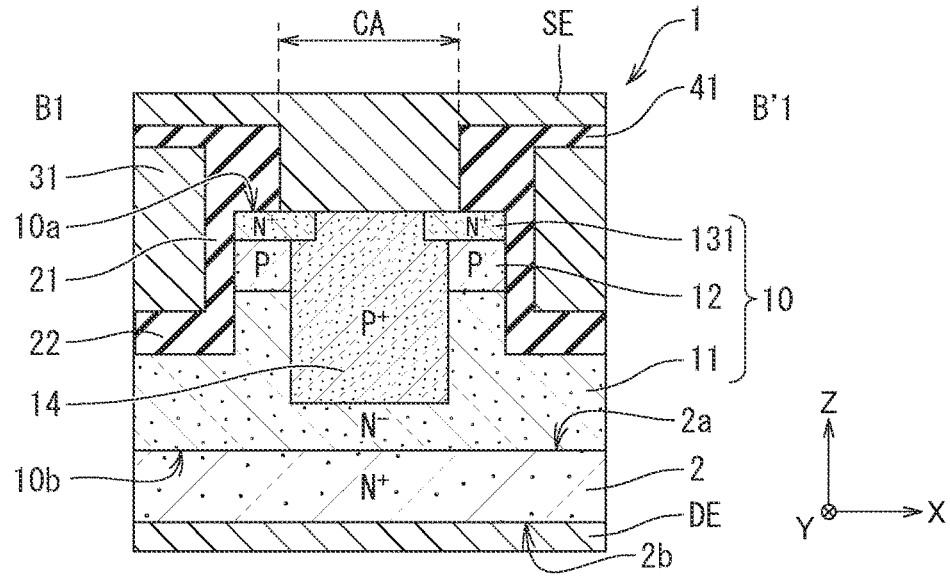
FIG. 4B is a cross-sectional view illustrating the exemplary structure of the nitride gallium semiconductor device according to Embodiment 1 of the present invention.
Figure 4C:
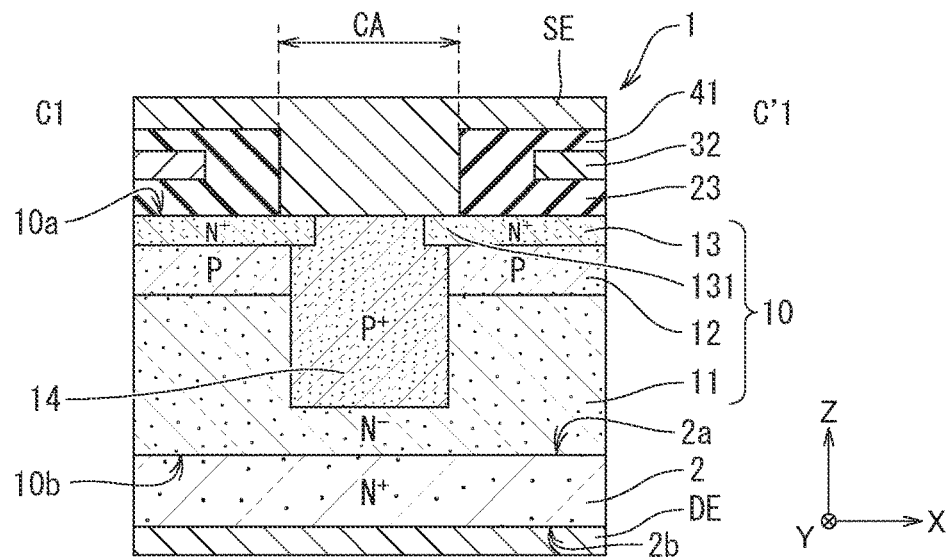
FIG. 4C is a cross-sectional view illustrating the exemplary structure of the nitride gallium semiconductor device according to Embodiment 1 of the present invention.

FIGS. 1 to 3 are plan views illustrating an exemplary structure of a nitride gallium semiconductor device 1 according to Embodiment 1 of the present invention (one example of "a nitride semiconductor device" of the present invention: hereinafter referred to as "GaN semiconductor device"). FIG. 2 is a view in which a gate electrode GE has been removed from the plan view illustrated in FIG. 1. FIG. 3 is a view in which a source region 13 and a source lead region 131 have been removed from the plan view illustrated in FIG. 2. FIGS. 4A to 4C are cross-sectional views illustrating the exemplary structure of the GaN semiconductor device 1 according to Embodiment 1 of the present invention. FIG. 4A is a cross-sectional view taken along line A1-A'1 of the plan view illustrated in FIG. 1. FIG. 4B is a cross-sectional view taken along line B1-B'1 of the plan view illustrated in FIG. 1. FIG. 4C is a cross-sectional view taken along line C1-C'1 of the plan view illustrated in FIG. 1.

In FIG. 1 to FIG. 4C, the X axis direction (one example of "a first direction" of the present invention) and the Y axis direction (one example of "a second direction" of the present invention) are directions parallel to the front surface 10a (one example of "a first main surface" of the present invention) of the GaN layer 10 that will be described later. The Z axis direction is a direction orthogonal to the front surface 10a of the GaN layer 10 and is also a depthwise direction of each trench 20 that will be described later. The X axis direction, the Y axis direction, and the Z axis direction are orthogonal to each other.

As illustrated in FIG. 1 to FIG. 4C, the GaN semiconductor device 1 is a vertical MOSFET (metal oxide semiconductor field effect transistor) having a trench gate structure. For example, the GaN semiconductor device 1 includes an N$^+$-type nitride gallium substrate (hereinafter referred to as GaN substrate) 2 and an N$^-$-type nitride gallium layer (hereinafter referred to as GaN layer) 10 provided on a front surface 2a of the GaN substrate 2. The GaN layer 10 includes a drift region 11, a P-type well region 12, an N$^+$-type source region 13, an N$^+$-type source lead region 131, and a P$^+$-type impurity region 14 (one example of "a first impurity region" of the present invention).

Additionally, the GaN semiconductor device 1 includes a plurality of trenches 20 provided in the GaN layer 10, a gate insulating film 21 and an insulating film 22 (one example of "a first insulating film" of the present invention) that are provided in the trenches 20, a gate electrode GE provided on a front surface 10a side of the GaN layer 10, a source electrode SE provided on the front surface 10a side of the GaN layer 10, and an insulating film 41 provided on the front surface 10a side of the GaN layer 10 and located between the gate electrode GE and the source electrode SE. In addition, the GaN semiconductor device 1 includes a drain electrode DE provided on a back surface 2b side of the GaN substrate 2. Hereinafter, each portion forming the GaN semiconductor device 1 will be described in detail.

The GaN substrate 2 is a GaN single crystal substrate. The GaN substrate 2 is an N-type substrate, and, for example, an N$^+$-type substrate. An N-type impurity contained in the GaN substrate 2 is at least one element of Si (silicon), O (oxygen), and Ge (germanium). For example, the N-type impurity contained in the GaN substrate 2 is Si or O, and the Si or O contained in the GaN substrate 2 has an impurity concentration of $2\times10^{18}$ cm$^{-3}$ or more.

Note that the GaN substrate 2 may be a low-dislocation free-standing substrate having a dislocation density of less than $1\times10^7$ cm$^{-2}$. When the GaN substrate 2 is a low-dislocation free-standing substrate, the dislocation density of the GaN layer 10 formed on the GaN substrate 2 is also reduced. Additionally, using a low-dislocation substrate as the GaN substrate 2 can reduce leakage current in a power device having a large area that is formed on the GaN substrate 2. This allows manufacturing equipment to manufacture the power device at a high yield rate. Additionally, it can prevent an ion-implanted impurity to be deeply diffused along dislocation during heat treatment.

The GaN layer 10 is provided on a front surface of the GaN substrate 2. The GaN layer 10 is a GaN single crystal layer that is a layer epitaxially formed on the front surface of the GaN substrate 2.

The drift region 11 is formed by doping an N-type impurity during an epitaxial growth process for forming the GaN layer 10. The drift region 11 has a lower N-type impurity concentration than the source region 13. The drift region 11 serves as a current path between the GaN substrate 2 and the well region 12.

The well region 12 is formed by doping a P-type impurity during the epitaxial growth process for forming the GaN layer 10. Alternatively, the well region 12 may be formed by performing heat treatment on a P-type impurity that has been ion-implanted at a predetermined depth from the front surface 10a of the GaN layer 10. The P-type impurity is, for example, Mg. At portions of the well region 12 in contact with the gate insulating film 21 and in the vicinities thereof, there are formed channels of the vertical MOSFET.

In the GaN semiconductor device 1, the plurality of channels and the source region 13 adjacent to the channels are arranged repetitively at constant intervals in one direction. In embodiments of the present invention, a unit structure including the plurality of channels and the source region 13 repetitively arranged at constant intervals in the one direction is referred to as channel cell CS. The plurality of channel cells CS extend in the X axis direction. Additionally, the plurality of channel cells CS are arranged at constant intervals in the Y axis direction. The Y axis direction is a direction of a channel width of the vertical MOSFET. A length (width) WCS of the channel cells CS in the Y axis direction is, for example, from 0.1 µm to 1 µm.

The source region 13 and the source lead region 131 are provided at the front surface 10a of the GaN layer 10 and in the vicinity thereof. The source region 13 and the source lead region 131 are formed by performing heat treatment on an N-type impurity that has been ion-implanted at a predetermined depth from the front surface 10a of the GaN layer 10. The source region 13 and the source lead region 131 are located on the well region 12 and in contact therewith.

Each source region 13 extends in the X axis direction. Each source lead region 131 extends in the Y axis direction. An end of the each source region 13 in the X axis direction is connected to the each source lead region 131. The source regions 13 overlap with the gate electrode GE in a planar view. The source lead regions 131 do not overlap with the gate electrode GE in the planar view.

The $P^+$-type impurity region 14 is provided at the front surface 10a of the GaN layer 10 and in the vicinity thereof. The impurity region 14 is formed by performing heat treatment on a P-type impurity that has been ion-implanted at a predetermined depth from the front surface 10a of the GaN layer 10. The impurity region 14 has a higher P-type impurity concentration (for example, a value obtained by offsetting an N-type impurity concentration from a P-type impurity concentration) than the channel cells CS.

In the GaN semiconductor device 1, one channel cell CS group arranged in the Y axis direction is adjacent, in the X axis direction, to another channel cell CS group arranged in the Y axis direction. The impurity region 14 is located between the one channel cell CS group and the other channel cell group CS adjacent to each other in the X axis direction. The impurity region 14 is in contact with the well region 12 and the source regions 13 of the one channel cell CS group and the well region 12 and the source regions 13 of the other channel cell CS group, respectively. Additionally, a depth of the impurity region 14 from the front surface 10a side is deeper than a depth of the well region 12 from the front surface 10a side. As a result, the impurity region 14 is also in contact with the drift region 11.

The impurity region 14 and the source lead regions 131 are in contact with the source electrode SE in a source contact region CA. The source contact region CA is arranged in a position away from a line of the plurality of channel cells CS arranged in the Y axis direction. For example, the source contact region CA is located between the one channel cell CS group and the other channel cell CS group adjacent to each other in the X axis direction. The source contact region CA is provided with a contact hole whose bottom surface includes the impurity region 14 and the source lead regions 131. Through the contact hole, the source electrode SE is in contact with the impurity region 14 and the source lead regions 131.

A width WCA of the source contact region CA in the X axis direction is, for example, from 1 µm to 5 µm. An arrangement interval PCA of the source contact region CA in the X axis direction is, for example, from 2 µm to 10 µm.

The plurality of trenches 20 extend in the X axis direction and are arranged at constant intervals in the Y axis direction. The trenches 20 are open on the front surface 10a side of the GaN layer 10. The trenches 20 are located between the plurality of channel cells CS. For example, each trench 20 is arranged between the one channel cell CS and the other channel cell CS adjacent to each other in the Y axis direction. In other words, the trenches 20 are arranged to sandwich each of the channel cells CS from both sides thereof in the Y axis direction. A length (width) W20 of the each trench 20 in the Y axis direction is, for example, from 0.1 µm to 1 µm.

The gate insulating film 21 is provided on side faces of each trench 20. The gate insulating film 21 is, for example, a silicon oxide ($SiO_2$) film or an aluminum oxide ($Al_2O_2$) film. The insulating film 22 is provided on a bottom surface of each trench 20. The insulating film 22 is, for example, an $SiO_2$ film or an $Al_2O_3$ film. The gate insulating film 21 and the insulating film 22 are in contact with each other in the each trench 20. For example, the insulating film 22 is larger in film thickness than the gate insulating film 21.

The gate electrode GE includes an electrode portion 31 arranged in each trench 20 and a wiring portion 32 extending in the Y axis direction so as to straddle the plurality of channel cells CS. The electrode portion 31 and the wiring portion 32 are connected to each other. The electrode portion 31 is adjacent to the channel cells CS via the gate insulating film 21. The gate electrode GE is formed of impurity-doped polysilicon. The insulating film 41 is provided on the gate electrode GE. The insulating film 41 is, for example, an $SiO_2$ film or an $Al_2O_3$ film.

The source electrode SE is arranged on the insulating film 41. The source electrode SE is in contact with the source lead regions 131 and the impurity region 14 through a contact hole provided in the insulating film 41. This allows on-current of the vertical MOSFET to flow through the source regions 13 and the source lead regions 131 to the source electrode SE. Additionally, the potential of the well region 12 is fixed to the potential of the source electrode SE via the impurity region 14.

The source electrode SE is made of Al or an Al—Si alloy. Additionally, the source electrode SE may include a barrier metal layer between the source electrode SE and the front surface 10a of the GaN layer 10. The barrier metal layer may be made of titanium (Ti). In other words, the source electrode SE may be a laminated layer including a Ti layer and an Al layer or a laminated layer including a Ti layer and an Al—Si alloy layer. The source electrode SE may be an electrode serving also as an unillustrated source pad or an electrode provided separately from the source pad.

As described hereinabove, the GaN semiconductor device 1 according to Embodiment 1 of the present invention includes the GaN layer 10, the plurality of channel cells CS provided in the GaN layer 10, the N+-type source lead region 131 provided in the GaN layer 10, and the source electrode SE provided on the front surface 10a side of the GaN layer 10. The channel cells CS each include the P-type well region 12 and the N+-type source regions 13 in contact with the well region 12. The source lead regions 131 are connected to the source regions 13. The plurality of channel cells CS extend in the X axis direction in the planar view, and are arranged in the Y axis direction intersecting with the X axis direction in the planar view. The source electrode SE is in contact with the source lead regions 131 in the source contact region CA away from the line of the plurality of channel cells CS arranged in the Y axis direction.

As a result, in the GaN semiconductor device 1, no source contact is needed above the channel cells CS and between the channel cells CS adjacent to each other in the Y axis direction. In the GaN semiconductor device 1, an arrangement interval PCS (see FIG. 4A) of the channel cells CS in the Y axis direction can be narrowed, which can increase an arrangement density of the channel cells CS in the Y axis direction. Thus, in the GaN semiconductor device 1, the channel width of the vertical MOSFET can be made large, thereby enabling reduction of on-resistance of the vertical MOSFET. In a GaN semiconductor device with a low-resistance drift region, channel resistance is relatively large, so that increasing the channel width is particularly effective in reducing on-resistance.

In addition, since no source contact is needed around the channel cells CS, there occurs no short circuit defect between the gate and source even when the arrangement interval of the channel cells CS in the Y axis direction is made small. As a result, the GaN semiconductor device 1 can suppress yield reduction due to a manufacturing process even when miniaturized.

In addition, the gate electrode GE has the trench gate structure in which the electrode portion 31 is arranged in the trenches 20. Since the channels of the vertical MOSFET are formed in the thickness direction (Z axis direction) of the GaN layer 10, the channel cells CS can be densely arranged in the Y axis direction. This can further increase the arrangement density of the channel cells CS.

(Modification 1)

Figure 5A:
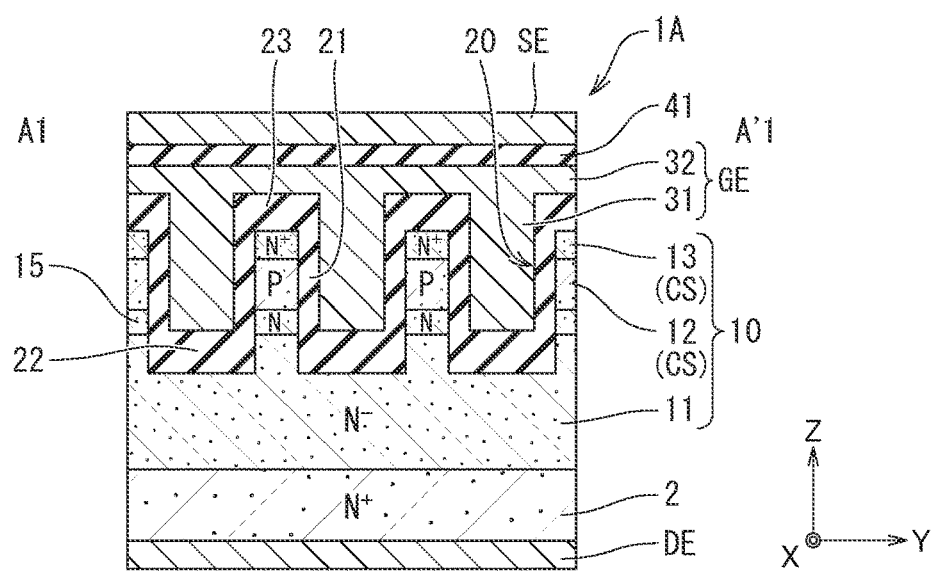
FIG. 5A is a cross-sectional view illustrating the structure of a nitride gallium semiconductor device according to Modification 1 of Embodiment 1 of the present invention.
Figure 5B:
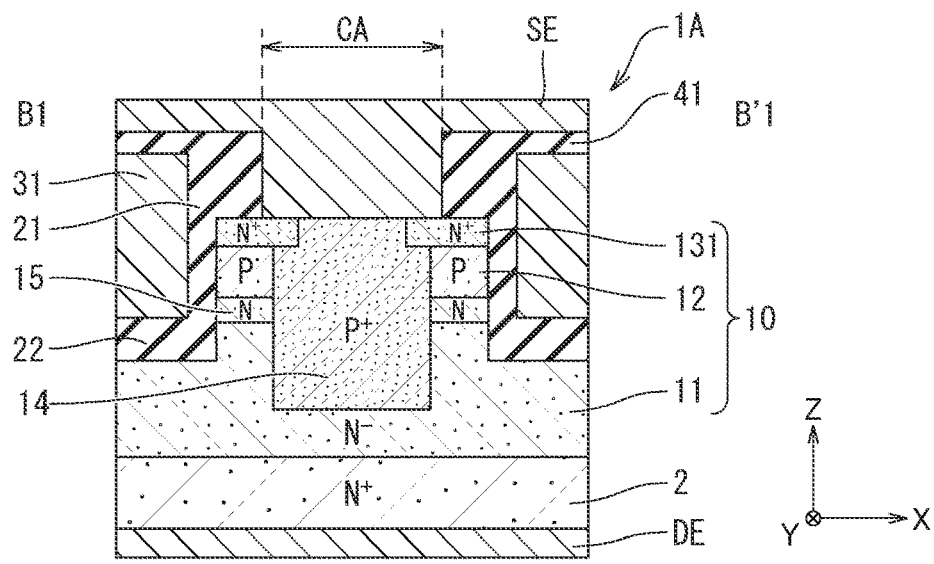
FIG. 5B is a cross-sectional view illustrating the structure of the nitride gallium semiconductor device according to Modification 1 of Embodiment 1 of the present invention.
Figure 5C:
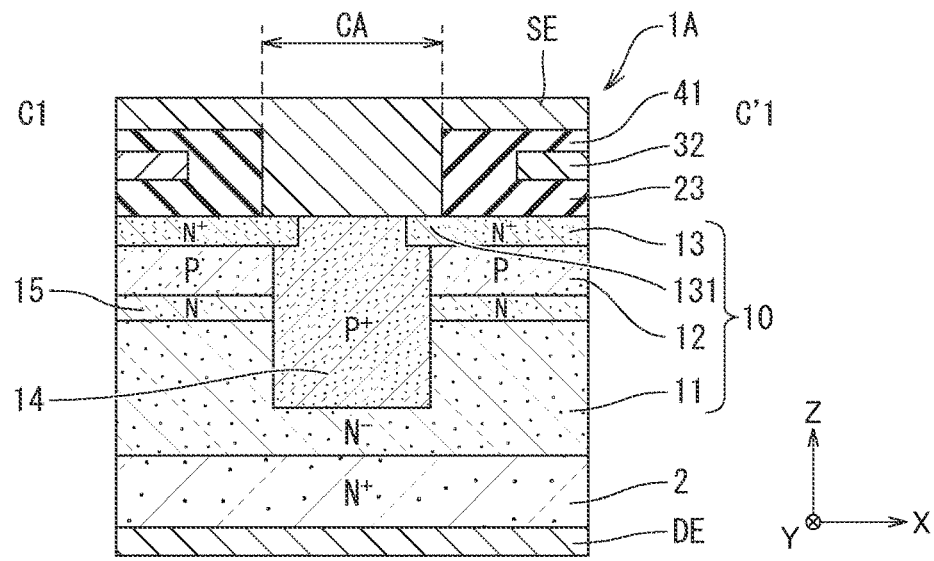
FIG. 5C is a cross-sectional view illustrating the structure of the nitride gallium semiconductor device according to Modification 1 of Embodiment 1 of the present invention.

FIGS. 5A to 5C are cross-sectional views illustrating the structure of a GaN semiconductor device 1A according to Modification 1 of Embodiment 1 of the present invention. FIG. 5A is a view corresponding to across section taken along line A1-A'1 of the plan view illustrated in FIG. 1. FIG. 5B is a view corresponding to a cross-section taken along line B1-B'1 of the plan view illustrated in FIG. 1. FIG. 5C is a view corresponding to a cross section taken along line C1-C'1 of the plan view illustrated in FIG. 1.

As illustrated in FIGS. 5A to 5C, the GaN semiconductor device 1A includes an N-type impurity region 15 (one example of "a second impurity region" of the present invention) provided in the GaN layer 10 and located between the channel cell CS and the drift region 11. The impurity region 15 has a higher N-type impurity concentration (for example, a value obtained by offsetting a P-type impurity concentration from an N-type impurity concentration) than the drift region 11. This can reduce spreading resistance immediately below the channel cells CS. Moreover, movement of electrons from the channel cells CS to the drift region 11 can be easily spread.

(Modification 2)

Figure 6:
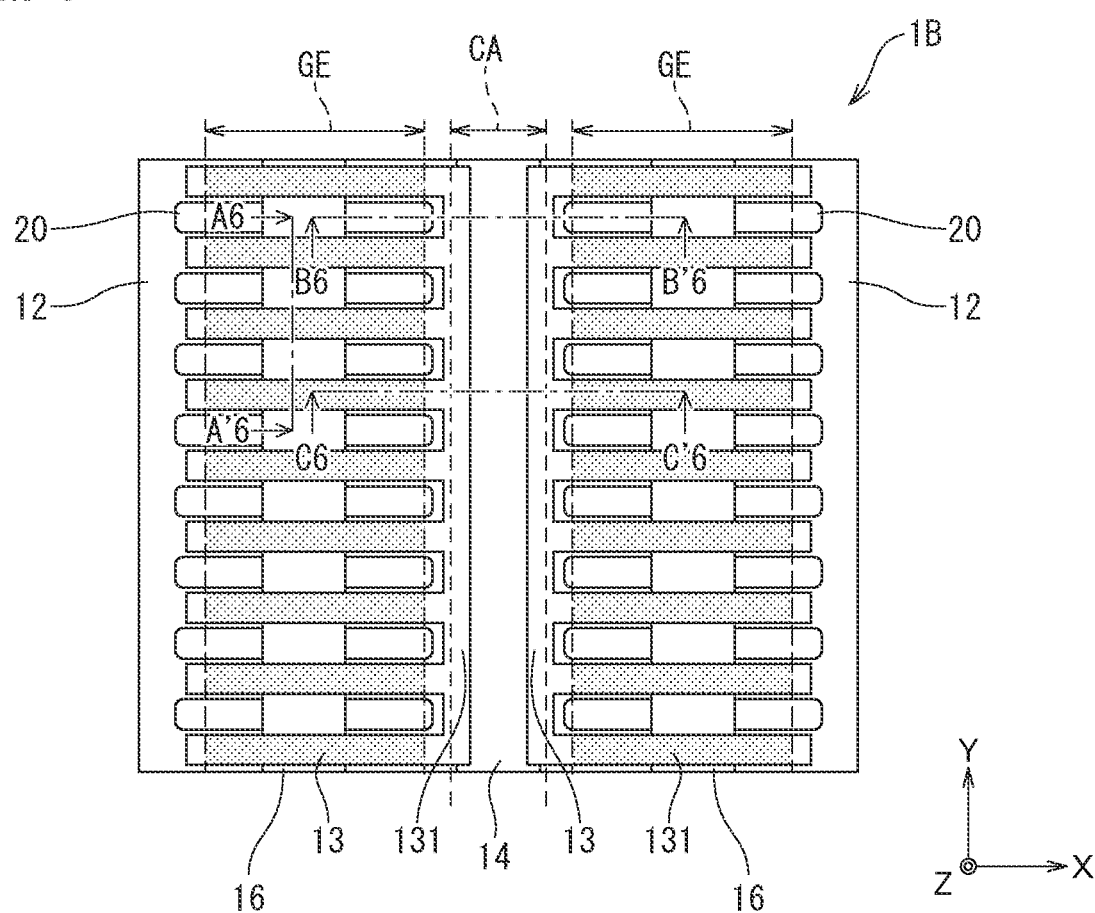
FIG. 6 is a plan view illustrating the structure of a nitride gallium semiconductor device according to Modification 2 of Embodiment 1 of the present invention.
Figure 7A:
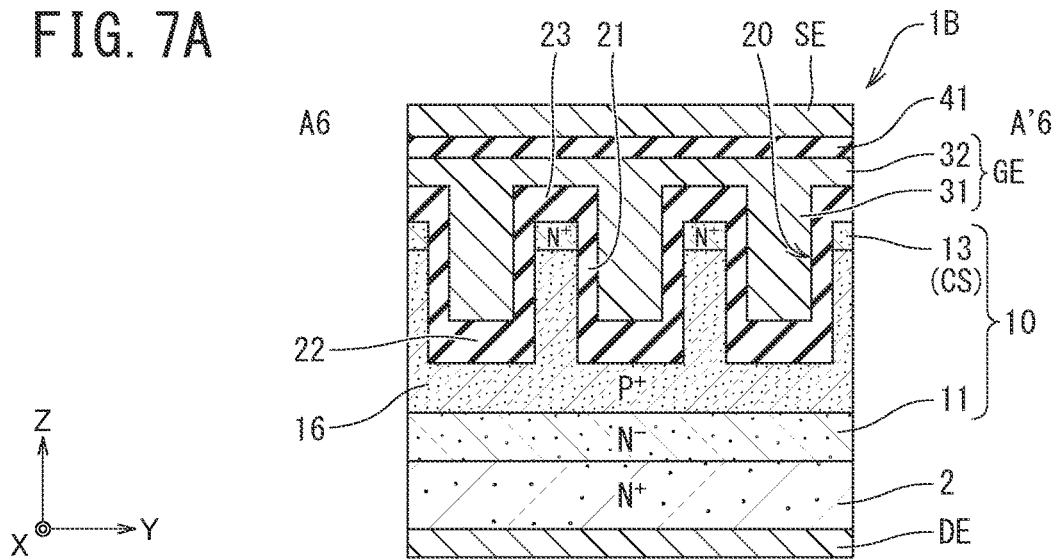
FIG. 7A is a cross-sectional view illustrating the structure of the nitride gallium semiconductor device according to Modification 2 of Embodiment 1 of the present invention.
Figure 7B:
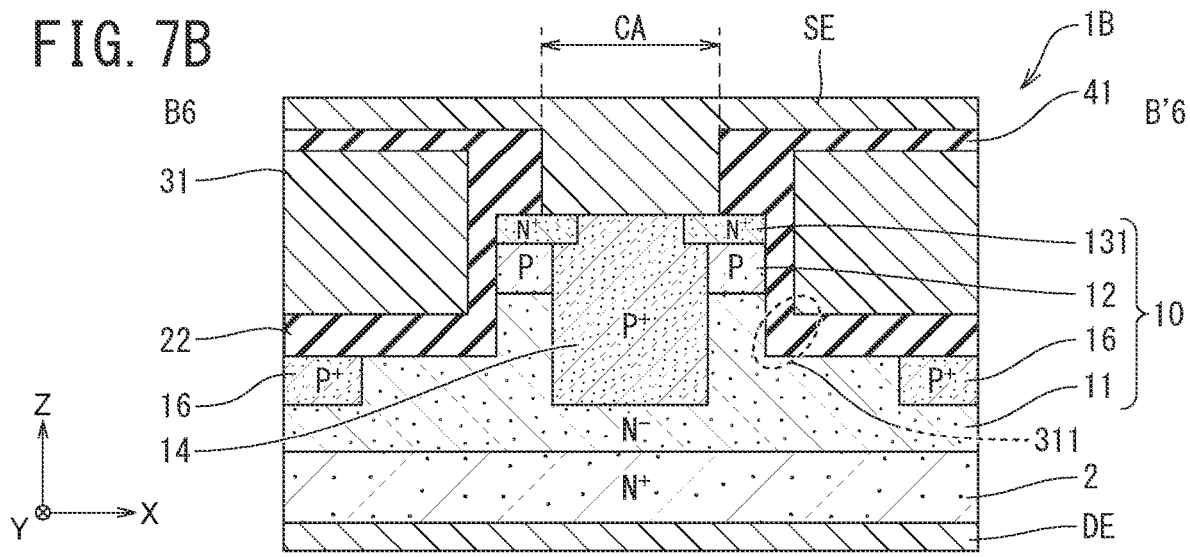
FIG. 7B is a cross-sectional view illustrating the structure of the nitride gallium semiconductor device according to Modification 2 of Embodiment 1 of the present invention.
Figure 7C:
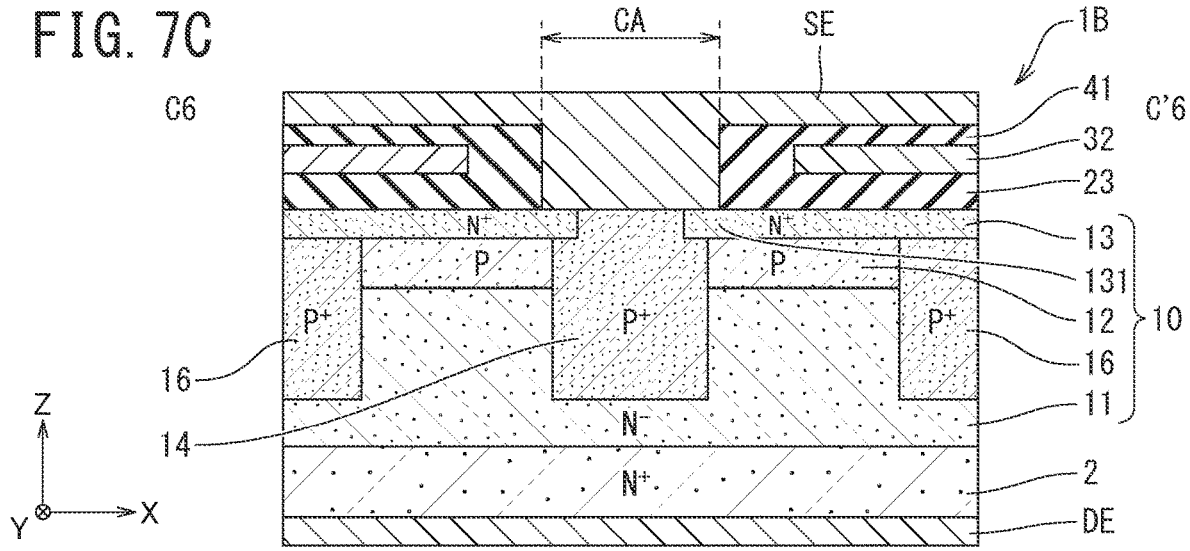
FIG. 7C is a cross-sectional view illustrating the structure of the nitride gallium semiconductor device according to Modification 2 of Embodiment 1 of the present invention.

FIG. 6 is a plan view illustrating the structure of a GaN semiconductor device 1B according to Modification 2 of Embodiment 1 of the present invention. FIGS. 7A to 7C are cross-sectional views illustrating the structure of the GaN semiconductor device 1B according to Modification 2 of Embodiment 1 of the present invention. FIG. 7A is a cross-sectional view taken along line A6-A' 6 of the plan view illustrated in FIG. 6. FIG. 7B is a cross-sectional view taken along line B6-B'6 of the plan view illustrated in FIG. 6. FIG. 7C is a cross-sectional view taken along line C6-C'6 of the plan view illustrated in FIG. 6.

As illustrated in FIG. 6 to FIG. 7C, the GaN semiconductor device 1B includes a P+-type impurity region 16 (one example of "a third impurity region" of the present invention) provided under the trenches 20 in the GaN layer 10. The impurity region 16 has a higher P-type impurity concentration (for example, a value obtained by offsetting an N-type impurity concentration from a P-type impurity concentration) than the well region 12. The impurity region 16 is adjacent to the electrode portion 31 of the gate electrode GE via the insulating film 22.

By doing this, the GaN semiconductor device 1B can moderate an electric field distribution below the electrode portion 31 arranged in the trenches 20. For example, although an electric field tends to concentrate in the vicinity of a corner portion 311 of the electrode portion 31, the presence of the impurity region 16 can suppress the electric field concentration in the vicinity of the corner portion 311. This can prevent occurrence of a short circuit defect between the gate and drain.

Note that, as illustrated in FIG. 6, preferably, the impurity region 16 extends in the Y axis direction, and is arranged in parallel to the trenches 20. By doing this, a distance between the corner portions 311 of the electrode portion 31 and the impurity region 16 can be made constant. Additionally, the impurity region 16 is preferably located in a position not overlapping with the source contact in a planar view. This can prevent the impurity region 16 from obstructing a current path between the source and drain In addition, although FIG. 7A illustrates a case where the P+-type impurity region 16 is in contact with the P-type well region 12, this is merely one example. In FIG. 7A, an N-type region (for example, an N−-type drift region 11) may be arranged between the P+-type impurity region 16 and the P-type well region 12. In this case, the P+-type impurity region 16 may be arranged at a position lower than the bottom surfaces of the trenches 20, and may not be arranged at a position upper than the bottom surfaces of the trenches 20. Even in such a case, the impurity region 16 can suppress the electric field concentration in the vicinity of the corner portion 311 illustrated in FIG. 7B.

Embodiment 2

The above Embodiment 1 has described the case where the vertical MOSFET has the trench gate structure. However, the present invention is not limited thereto. A nitride semiconductor device according to Embodiment 2 of the present invention may be a vertical MOSFET having a planar structure. The planar structure may be a DMOS (double diffused MOSFET) structure.

Figure 8:
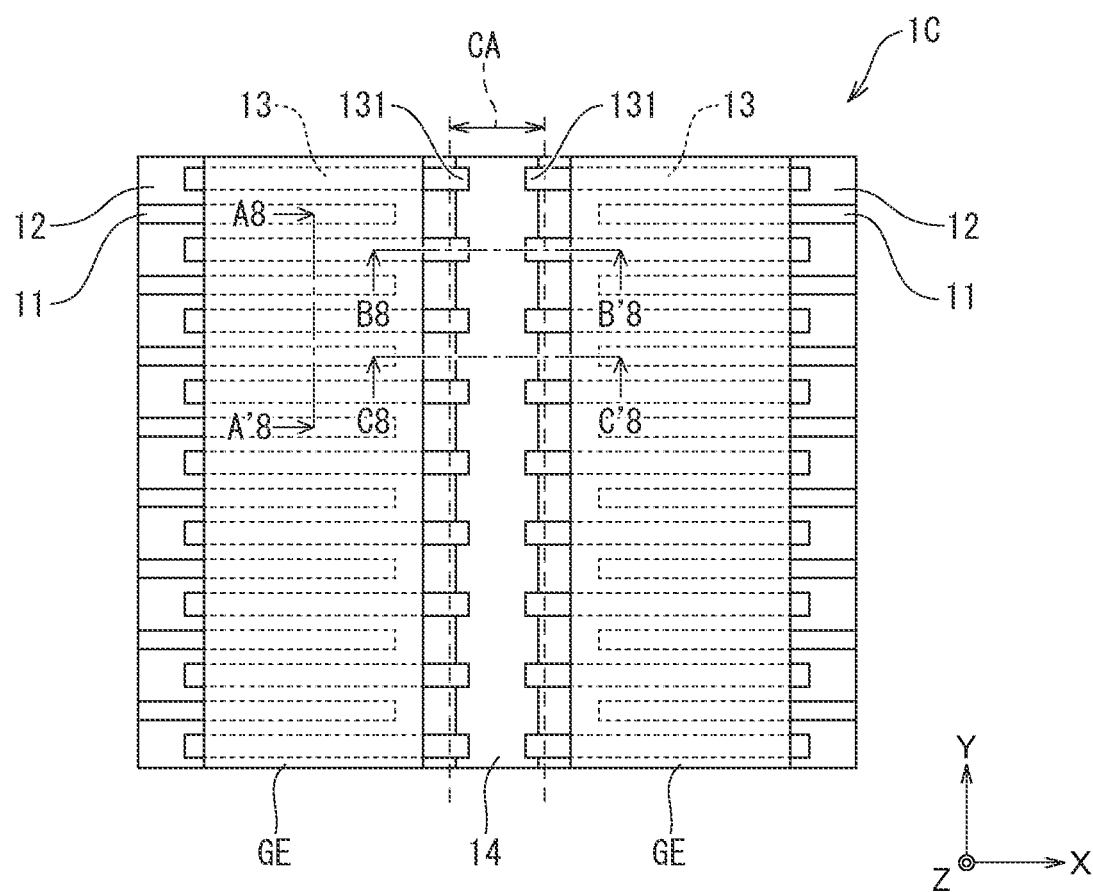
FIG. 8 is a plan view illustrating an exemplary structure of a nitride gallium semiconductor device according to Embodiment 2 of the present invention.
Figure 9A:
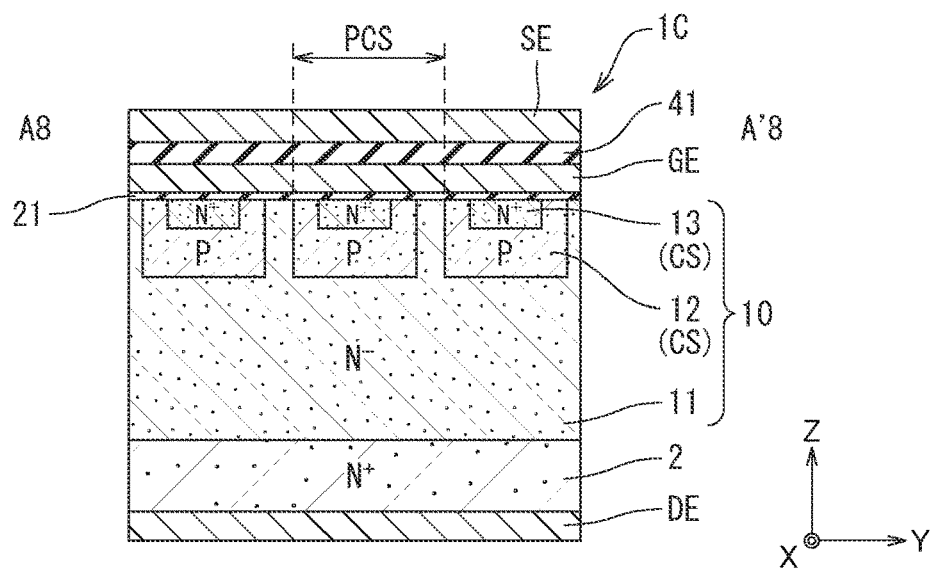
FIG. 9A is a cross-sectional view illustrating the exemplary structure of the nitride gallium semiconductor device according to Embodiment 2 of the present invention.
Figure 9B:
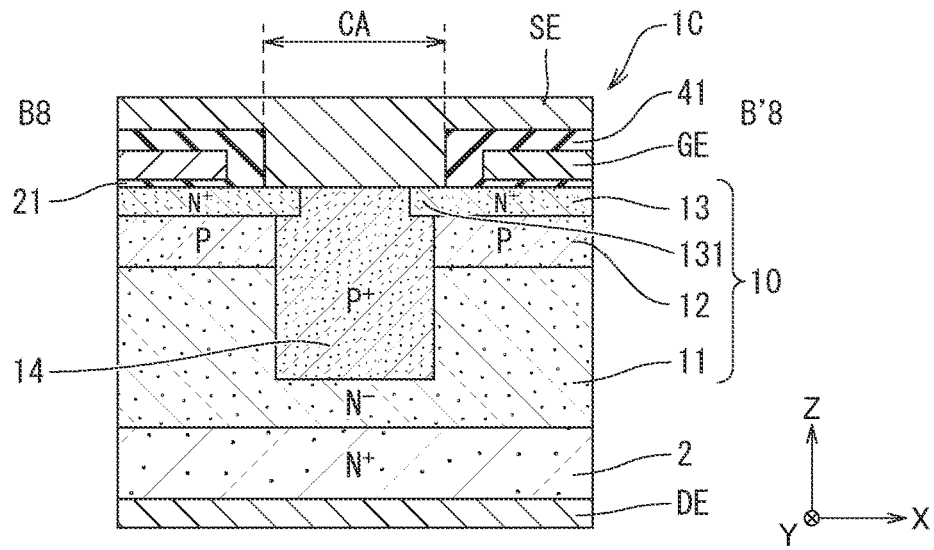
FIG. 9B is a cross-sectional view illustrating the exemplary structure of the nitride gallium semiconductor device according to Embodiment 2 of the present invention.
Figure 9C:
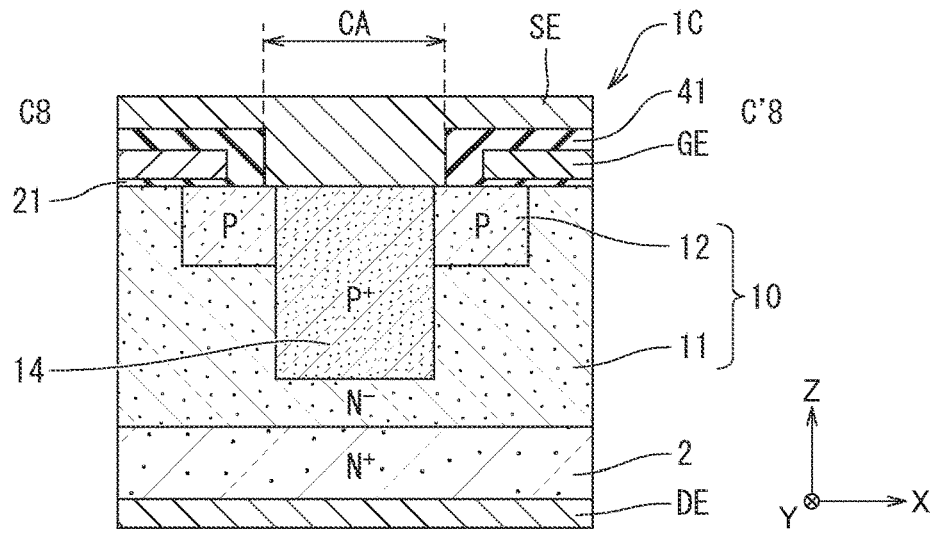
FIG. 9C is a cross-sectional view illustrating the exemplary structure of the nitride gallium semiconductor device according to Embodiment 2 of the present invention.

FIG. 8 is a plan view illustrating an exemplary structure of a GaN semiconductor device 1C according to Embodiment 2 of the present invention. FIGS. 9A to 9C are cross-sectional views illustrating the exemplary structure of a GaN semiconductor device 1C according to Embodiment 2 of the present invention. FIG. 9A is a cross-sectional view taken along line A8-A' 8 of the plan view illustrated in FIG. 8. FIG. 9B is a cross-sectional view taken along line B8-B'8 of the plan view illustrated in FIG. 8. FIG. 9C is a cross-sectional view taken along line C8-C'8 of the plan view illustrated in FIG. 8.

As illustrated in FIG. 8 to FIG. 9C, the GaN semiconductor device 1C is a vertical MOSFET having a DMOS structure. In the GaN semiconductor device 1C, the channel cells CS each include a P-type well region 12 and an N$^+$-type source region 13 arranged inside the well region 12. Channels of the vertical MOSFET are formed in portions located at surfaces of the well regions 12 and in the vicinities thereof, which are located on both sides of the source regions 13 in the Y axis direction.

Even in the GaN semiconductor device 1C, the plurality of channel cells CS extend in the X axis direction in a planar view from the Z axis direction, and are arranged in the Y axis direction. Additionally, each N$^+$-type source lead region 131 extends in the X axis direction. The each source lead region 131 is connected to an end portion of each source region 13 in the X axis direction.

The gate insulating film 21 is provided on the front surface 10a of the GaN layer 10 including the channel cells CS. The gate electrode GE is provided on the gate insulation film 21. The source electrode SE is provided on the gate electrode GE via the insulating film 41.

The source electrode SE is connected to each source lead region 131 in a position away from the line of the plurality of channel cells CS arranged in the Y axis direction.

In the GaN semiconductor device 1C, no source contact is needed above the channel cells CS and between the channel cells CS adjacent to each other in the Y axis direction, as in the case of the GaN semiconductor device 1 described in Embodiment 1. Thus, in the GaN semiconductor device 1C, the arrangement interval PCS (see FIG. 9A) of the channel cells CS in the Y axis direction can be narrowed, which can increase the arrangement density of the channel cells CS in the Y axis direction. Thus, in the GaN semiconductor device 1C, the channel width of the vertical MOSFET can be made large, thereby enabling reduction of on-resistance of the vertical MOSFET.

(Modification 1)

Figure 10A:
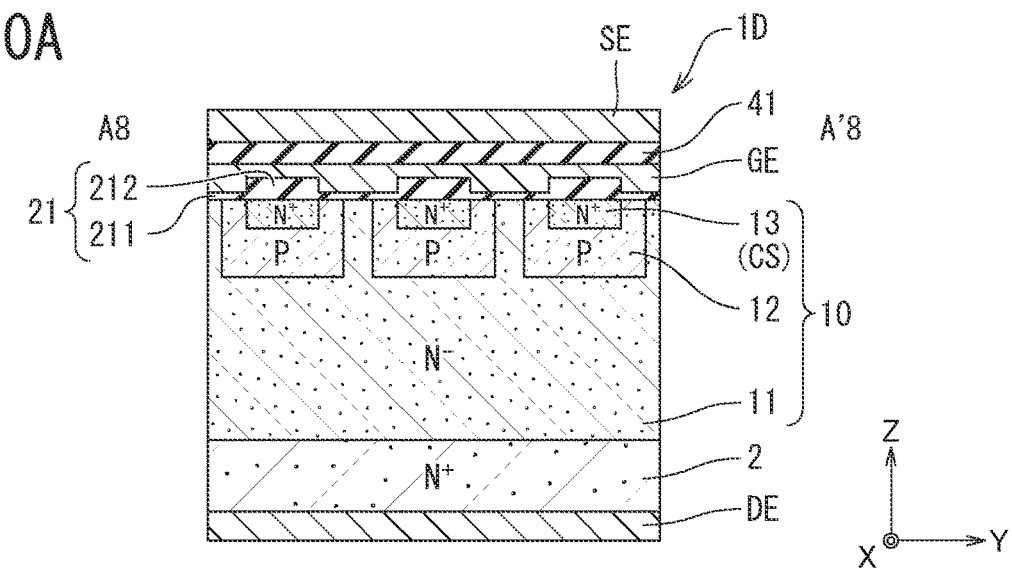
FIG. 10A is a cross-sectional view illustrating the structure of a nitride gallium semiconductor device according to Modification 1 of Embodiment 2 of the present invention.
Figure 10B:
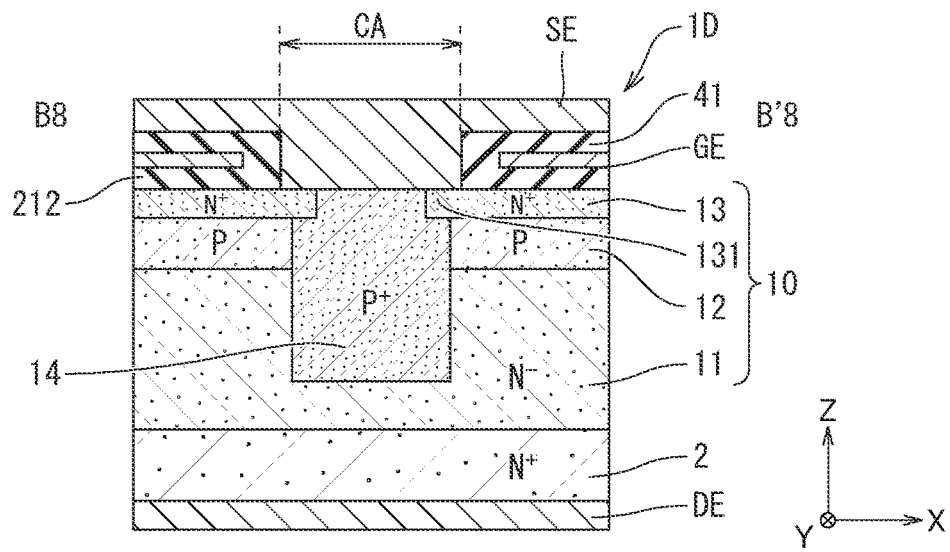
FIG. 10B is a cross-sectional view illustrating the structure of the nitride gallium semiconductor device according to Modification 1 of Embodiment 2 of the present invention.
Figure 10C:
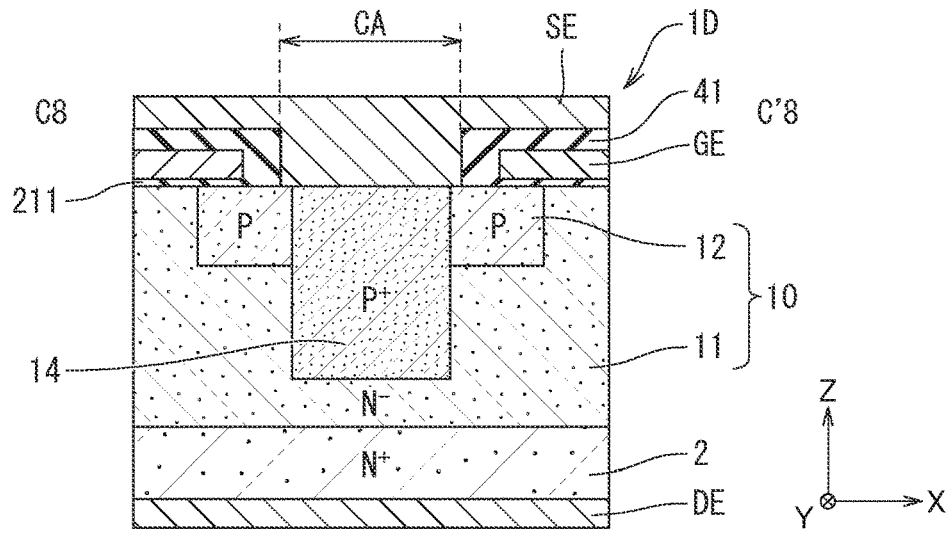
FIG. 10C is a cross-sectional view illustrating the structure of the nitride gallium semiconductor device according to Modification 1 of Embodiment 2 of the present invention.

FIGS. 10A to 10C are cross-sectional views illustrating the structure of a GaN semiconductor device 1D according to Modification 1 of Embodiment 2 of the present invention. FIG. 10A is a view corresponding to a cross section taken along line A8-A'8 of the plan view illustrated in FIG. 8. FIG. 10B is a view corresponding to a cross section taken along line B8-B'8 of the plan view illustrated in FIG. 8. FIG. 10C is a view corresponding to a cross section taken along line C8-C'8 of the plan view illustrated in FIG. 8.

As illustrated in FIGS. 10A to 10C, a portion of the gate insulating film 21 located on each source region 13 may be formed to be thicker than the other portion thereof. For example, the gate insulating film 21 includes a first portion 211 located on the well region 12 and a second portion 212 located on the source region 13. The second portion 212 has a thicker film thickness than the first portion 211. With such a structure, a capacity between the source and gate can be reduced.

(Modification 2)

Figure 11:
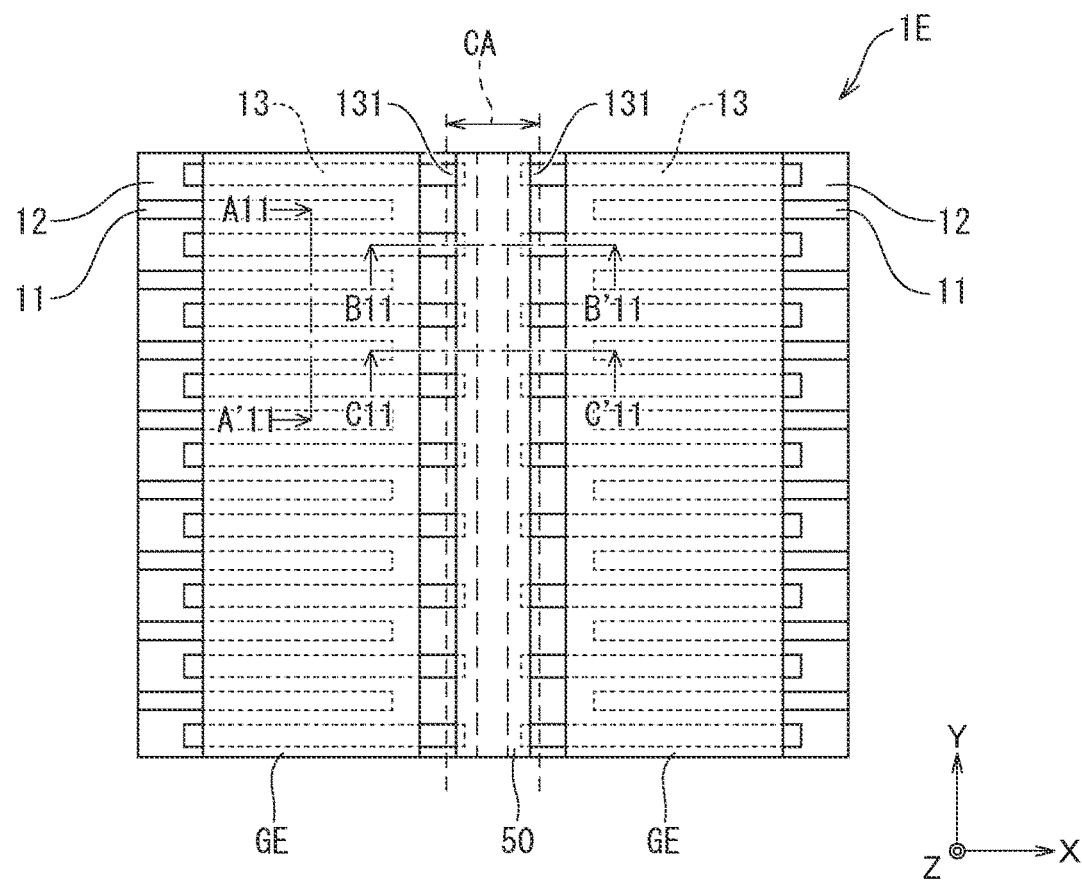
FIG. 11 is a plan view illustrating the structure of a nitride gallium semiconductor device according to Modification 2 of Embodiment 2 of the present invention.
Figure 12A:
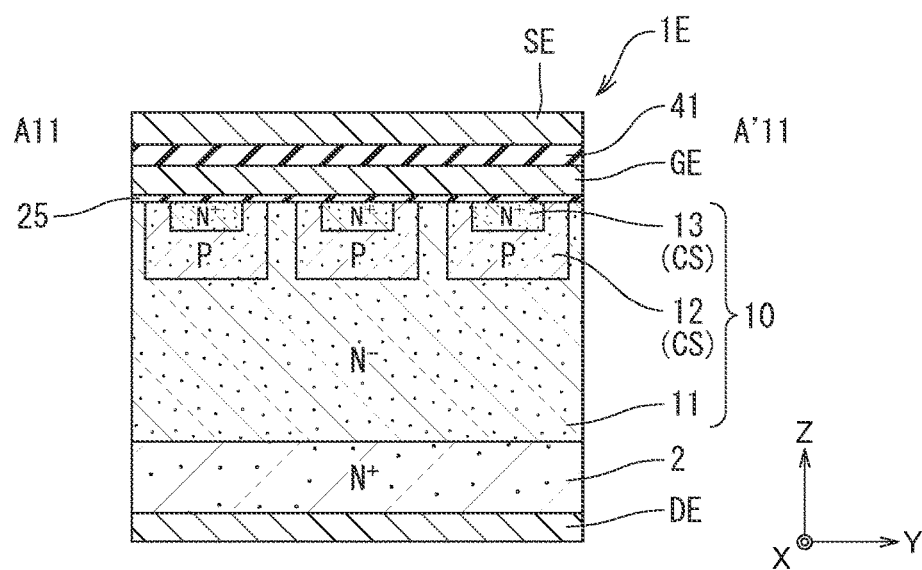
FIG. 12A is a cross-sectional view illustrating the structure of the nitride gallium semiconductor device according to Modification 2 of Embodiment 2 of the present invention.
Figure 12B:
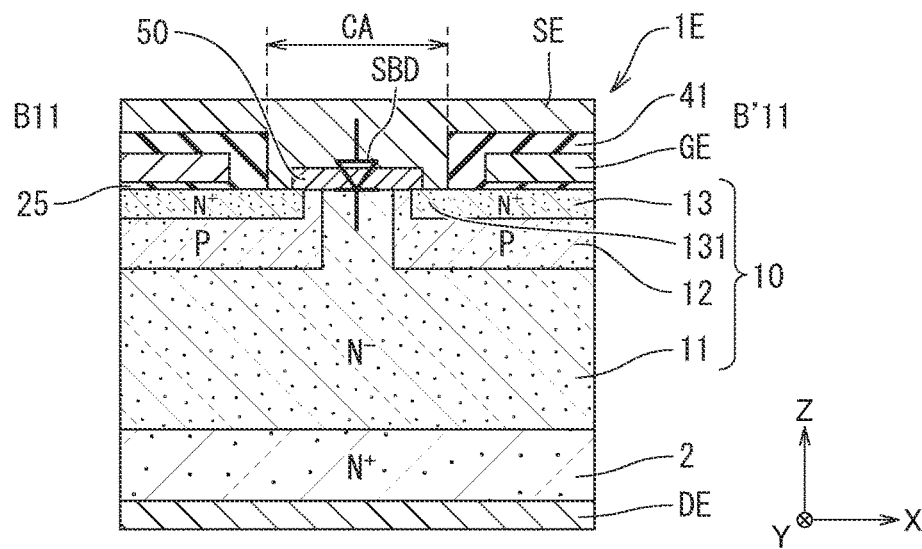
FIG. 12B is a cross-sectional view illustrating the structure of the nitride gallium semiconductor device according to Modification 2 of Embodiment 2 of the present invention.
Figure 12C:
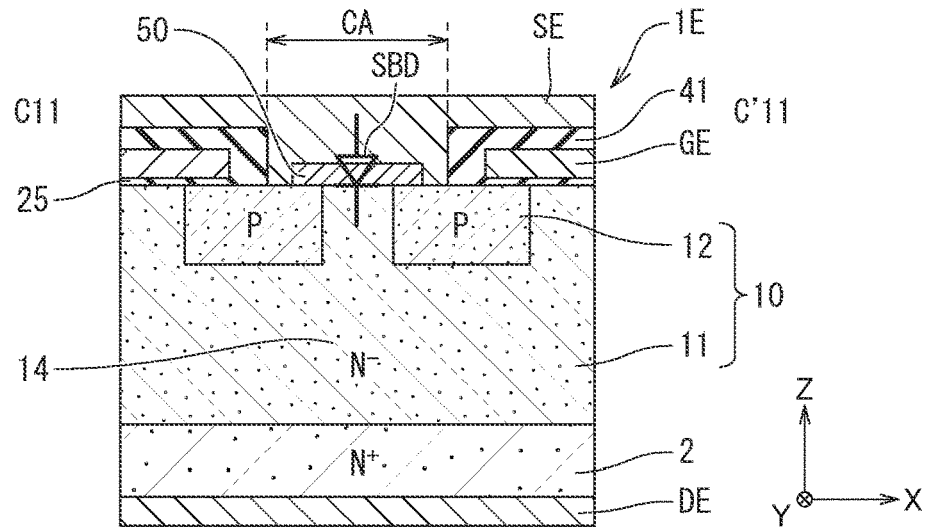
FIG. 12C is a cross-sectional view illustrating the structure of the nitride gallium semiconductor device according to Modification 2 of Embodiment 2 of the present invention.

FIG. 11 is a plan view illustrating the structure of a GaN semiconductor device 1E according to Modification 2 of Embodiment 2 of the present invention. FIGS. 12A to 12C are cross-sectional views illustrating the structure of the GaN semiconductor device 1E according to Modification 2 of Embodiment 2 of the present invention. FIG. 12A is a cross-sectional view taken along line A11-A'11 of the plan view illustrated in FIG. 11. FIG. 12B is a cross-sectional view taken along line B11-B'11 of the plan view illustrated in FIG. 11. FIG. 12C is a cross-sectional view taken along line C11-C'11 of the plan view illustrated in FIG. 11.

As illustrated in FIG. 11 to FIG. 12C, the GaN semiconductor device 1E includes a metal film 50 provided on the drift region 11 in the source contact region CA away from the line of the plurality of channel cells CS arranged in the Y axis direction. For example, in the GaN semiconductor device 1E, the P$^+$-type impurity region 14 is not provided in the source contact region CA. In the source contact region CA, the drift region 11 is appearing at the front surface 10a of the GaN layer 10. The metal film 50 is provided on the drift region 11. The metal film 50 extends in the Y axis direction. The metal film 50 is made of, for example, a Schottky metal, such as Ni or an Ni-containing alloy.

The source electrode SE is provided on the metal film 50. The metal film 50 is interposed between the source electrode SE and the drift region 11 and between the source electrode SE and the well region 12. The source electrode SE is connected to the drift region 11 and the well region 12 via the metal film 50.

In the GaN semiconductor device 1E having the above structure, a Schottky barrier diode SBD is formed between the metal film 50 and the drift region 11 and between the metal film 50 and the well region 12. In the GaN semiconductor device 1E, the Schottky barrier diode SBD can be incorporated in the GaN layer 10.

In a GaN semiconductor device, a PN junction diode is formed between the P-type well region 12 and the N$^-$-type drift region 11. However, in the PN junction diode, forward voltage is large, and incorporated diode characteristics may be insufficient. On the other hand, in the GaN semiconductor device 1E, the Schottky barrier diode SBD is formed between the metal film 50 and the drift region 11. In the Schottky barrier diode SBD, forward voltage can be adjusted to a desired value by selecting the material of the metal film 50. For example, the forward voltage thereof can be made lower than that of the above PN junction diode. Since the GaN semiconductor device 1E includes the Schottky barrier diode SBD, the incorporated diode characteristics can be improved.

Additionally, the Schottky barrier diode SBD is formed in a position away from the line of the plurality of channel cells CS arranged in the Y axis direction. The Schottky barrier diode SBD is not arranged between the channel cells CS adjacent to each other in the Y axis direction. Thus, without hindering miniaturization and high densification of the channel cells CS, the GaN semiconductor device 1E can incorporate the Schottky barrier diode SBD.

Other Embodiments

As described above, while the present invention has been described using the embodiments and the modifications, it should be understood that the description and drawings forming a part of this disclosure do not limit the invention. Various alternative embodiments and modifications will be made apparent to those skilled in the art from this disclosure.

For example, as the gate insulating film 21, a silicon oxynitride (SiON) film, a strontium oxide (SrO) film, or a silicon nitride (SiN) film can also be used. In addition, as the gate insulating film 21, a composite film or the like formed by laminating some single-layer insulating films can also be used. A vertical MOSFET using an insulating film other than an SiO$_2$ film as the gate insulating film 21 may be called vertical MISFET. The term MISFET means a more comprehensive insulated gate transistor, including MOSFET.

Thus, it is obvious that the present invention includes various embodiments and the like that have not been described herein. At least one of various omissions, substitutions, and changes of the components can be made without departing the gist of the above-described embodiments and respective modifications. Additionally, the effects described in the present specification are merely examples and not limitative, and other effects may also be provided. The technological scope of the invention is determined only by the features of the invention according to the proper claims.

Note that the present invention can also be configured as follows:

(1) A nitride semiconductor device including:
a nitride semiconductor layer;
a plurality of channel cells provided in the nitride semiconductor layer and each including a well region of a first conductivity type and a source region of a second conductivity type in contact with the well region;
a source lead region of the second conductivity type provided in the nitride semiconductor layer and connected to the source region; and
a source electrode provided on a side where a first main surface of the nitride semiconductor layer is located, in which the plurality of channel cells extend in a first direction in a planar view from a normal direction of the first main surface, and are arranged in a second direction intersecting with the first direction in the planar view; and
in which the source electrode is in contact with the source lead region in a position away from a line of the plurality of channel cells arranged in the second direction.

(2) The nitride semiconductor device according to the above (1), in which the source lead region extends in the second direction.

(3) The nitride semiconductor device according to the above (1) or (2), further including a gate electrode provided on the side where the first main surface is located, the gate electrode extending in the second direction to straddle the plurality of channel cells.

(4) The nitride semiconductor device according to the above (3), further including a trench provided in the nitride semiconductor layer and located between the plurality of channel cells and a gate insulating film provided on side faces of the trench, in which the gate electrode includes an electrode portion provided in the trench and adjacent to the channel cells via the gate insulating film.

(5) The nitride semiconductor device according to any one of the above (1) to (4), further including a first impurity region of the first conductivity type provided in the nitride semiconductor layer and being in contact with the source lead region, in which the first impurity region has a higher first conductivity type impurity concentration than the well region, and is deeper in depth from the first main surface side than the well region; and in which the source electrode is in contact with the first impurity region in the position away from the line of the plurality of channel cells arranged in the second direction.

(6) The nitride semiconductor device according to any one of the above (1) to (5), further including a drift region of the second conductivity type provided in the nitride semiconductor layer and a second impurity region of the second conductivity type provided in the nitride semiconductor layer and located between the channel cells and the drift region, in which the second impurity region has a higher second conductivity type impurity concentration than the drift region.

(7) The nitride semiconductor device according to the above (4), further including a first insulating film provided on a bottom surface of the trench and a third impurity region of the first conductivity type provided under the trench in the nitride semiconductor layer, in which the third impurity region is adjacent to the gate electrode via the first insulating film.

(8) The nitride semiconductor device according to the above (3), further including a gate insulating film provided on the plurality of channel cells, the gate electrode being provided on the gate insulating film.

(9) The nitride semiconductor device according to the above (8), in which the gate insulating film includes a first portion located on the well region and a second portion located on the source region, the second portion having a larger film thickness than the first portion.

(10) The nitride semiconductor device according to the above (8) or (9), further including a drift region of the second conductivity type provided in the nitride semiconductor layer and a metal film provided on the drift region, in which the source electrode is in contact with the metal film in the position away from the line of the plurality of channel cells arranged in the second direction.

REFERENCE SIGNS LIST

1: GaN semiconductor device
1A, 1B, 1C, 1D, 1E: GaN semiconductor device
2: GaN substrate
2a, 10a: Front surface
2b: Back surface
10: GaN layer
11: Drift region
12: Well region
13: Source region
14, 15, 16: Impurity region
20: Trench
21: Gate insulating film
22, 41: Insulating film
31: Electrode portion
32: Wiring portion
50: Metal film
53: Source electrode
131: Source lead region
211: First portion
212: Second portion
311: Corner portion
CA: Source contact region
CS: Channel cell
DE: Drain electrode
GE: Gate electrode
PCA, PCS: Arrangement interval
SBD: Schottky barrier diode
W20, WCA, WCS: Width

The invention claimed is:
1. A nitride semiconductor device, comprising:
a nitride semiconductor layer;
a plurality of channel cells provided in the nitride semiconductor layer and each including a well region of a first conductivity type and a source region of a second conductivity type in contact with the well region;
a source lead region of the second conductivity type provided in the nitride semiconductor layer and connected to the source region; and a source electrode provided on a side where a first main surface of the nitride semiconductor layer is located,
wherein
the plurality of channel cells extend in a first direction in a planar view from a normal direction of the first main surface, and are arranged in a second direction intersecting with the first direction in the planar view,
the source electrode is in contact with the source lead region in a position spaced apart from a line of the plurality of channel cells which are arranged in the second direction, and
the source region and the source lead region are located on the well region and in contact with the well region.

2. The nitride semiconductor device according to claim 1, wherein the source lead region extends in the second direction.

3. The nitride semiconductor device according to claim 1, further comprising a gate electrode provided on the side where the first main surface is located, the gate electrode extending in the second direction to straddle the plurality of channel cells.

4. The nitride semiconductor device according to claim 3, further comprising a trench provided in the nitride semiconductor layer and located between the plurality of channel cells and a gate insulating film provided on side faces of the trench, wherein the gate electrode includes an electrode portion provided in the trench and adjacent to the channel cells via the gate insulating film.

5. The nitride semiconductor device according to claim 4, further comprising:
a first insulating film provided on a bottom surface of the trench; and
an impurity region of the first conductivity type provided below the trench in the nitride semiconductor layer and directly adjacent to the first insulating film.

6. The nitride semiconductor device according to claim 3, further comprising a gate insulating film provided on the plurality of channel cells, the gate electrode being provided on the gate insulating film.

7. The nitride semiconductor device according to claim 6, wherein the gate insulating film includes a first portion located on the well region and a second portion located on the source region between the source region and the source electrode in a depth direction, the second portion having a larger film thickness than the first portion.

8. The nitride semiconductor device according to claim 1, further comprising:
an impurity region of the first conductivity type provided in the nitride semiconductor layer and in contact with the source lead region,
wherein
the impurity region has a higher first conductivity type impurity concentration than the well region, and is deeper in depth from the first main surface side than the well region, and
the source electrode is in contact with the impurity region at the position spaced apart the line of the plurality of channel cells which are arranged in the second direction.

9. The nitride semiconductor device according to claim 1, further comprising:
a drift region of the second conductivity type provided in the nitride semiconductor layer; and
an impurity region of the second conductivity type provided in the nitride semiconductor layer and located between the channel cells and the drift region,
wherein the impurity region has a higher second conductivity type impurity concentration than the drift region.

10. The nitride semiconductor device according to claim 1, further comprising:
an impurity region of the first conductivity type provided in the nitride semiconductor layer and in contact with the source lead region,
wherein
the impurity region has a higher first conductivity type impurity concentration than the well region, and is deeper in depth from the first main surface side than the well region.

11. The nitride semiconductor device according to claim 1, further comprising:
an impurity region of the first conductivity type provided in the nitride semiconductor layer,
wherein
the impurity region contacts the source lead region and contacts the source electrode, and
the impurity region has a higher first conductivity type impurity concentration than the well region, and is deeper in depth from the first main surface side than the well region.

12. The nitride semiconductor device according to claim 1, further comprising:
a gate electrode provided on the side where the first main surface is located, the gate electrode extending in the second direction to straddle the plurality of channel cells;
a trench provided in the nitride semiconductor layer and located between the plurality of channel cells, wherein the gate electrode includes an electrode portion provided in the trench and adjacent to the channel cells;
a drift region of the second conductivity type provided in the nitride semiconductor layer; and
an impurity region of the first conductivity type provided between a bottom of the trench and a portion of the drift region.

13. The nitride semiconductor device according to claim 1, wherein the nitride semiconductor device is a vertical metal oxide semiconductor field effect transistor.

14. A nitride semiconductor device comprising:
a nitride semiconductor layer;
a plurality of channel cells provided in the nitride semiconductor layer and each including a well region of a first conductivity type and a source region of a second conductivity type in contact with the well region;
a source lead region of the second conductivity type provided in the nitride semiconductor layer and connected to the source region;
a source electrode provided on a side where a first main surface of the nitride semiconductor layer is located;
a drift region of the second conductivity type provided in the nitride semiconductor layer, wherein the drift region extends to the first main surface of the nitride semiconductor layer; and
a metal film provided directly on the drift region,
wherein
the plurality of channel cells extend in a first direction in a planar view from a normal direction of the first main surface, and are arranged in a second direction intersecting with the first direction in the planar view,
the source electrode contacts the source lead region, and
the source electrode contacts the metal film at a position spaced apart from a line of the plurality of channel cells which are arranged in the second direction, so as to form a Schottky barrier diode between the metal film and the drift region.

\* \* \* \* \*

UNITED STATES PATENT AND TRADEMARK OFFICE
CERTIFICATE OF CORRECTION

| | | |
|---|---|---|
| PATENT NO. | : 11,316,013 B2 | |
| APPLICATION NO. | : 16/776010 | |
| DATED | : April 26, 2022 | |
| INVENTOR(S) | : Ueno | |

It is certified that error appears in the above-identified patent and that said Letters Patent is hereby corrected as shown below:

In the Claims

Column 14, Line 44:
In Claim 14, delete "device" and insert --device,--.

Signed and Sealed this
Twenty-eighth Day of June, 2022

*Katherine Kelly Vidal*

Katherine Kelly Vidal
*Director of the United States Patent and Trademark Office*